United States Patent
Sestok

(10) Patent No.: US 8,725,441 B2
(45) Date of Patent: May 13, 2014

(54) ANTENNA MATCHING NETWORK TUNING METHOD

(75) Inventor: Charles Kasimer Sestok, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 245 days.

(21) Appl. No.: 13/206,203

(22) Filed: Aug. 9, 2011

(65) Prior Publication Data

US 2012/0041699 A1 Feb. 16, 2012

Related U.S. Application Data

(60) Provisional application No. 61/373,273, filed on Aug. 12, 2010.

(51) Int. Cl.
*G01R 15/00* (2006.01)
*G06F 11/30* (2006.01)

(52) U.S. Cl.
USPC .............. 702/65; 702/121; 702/182; 702/189

(58) Field of Classification Search
USPC .................... 702/65, 107, 117–122, 182, 189
See application file for complete search history.

(56) References Cited

U.S. PATENT DOCUMENTS 6,961,368 B2 * 11/2005 Dent et al. .................... 375/219
7,928,913 B2 * 4/2011 Kaneda et al. ......... 343/700 MS \* cited by examiner

*Primary Examiner* — Phuong Huynh
(74) *Attorney, Agent, or Firm* — Warren L. Franz; Wade J. Brady, III; Frederick J. Telecky, Jr.

(57) ABSTRACT

A matching network having a pi configuration between an antenna and another component in an RF circuit may be tuned by a process including computing the admittance of the antenna using measured reflection coefficients from three settings of the matching network, and identifying capacitance values for tuning the matching network. Capacitance values for an antenna side shunt and a circuit side shunt are found by computing target susceptance value for the shunts and comparing to a list of available susceptance values. The capacitance values corresponding to the available susceptances closest to the target susceptances are used to tune the antenna side shunt.

20 Claims, 4 Drawing Sheets

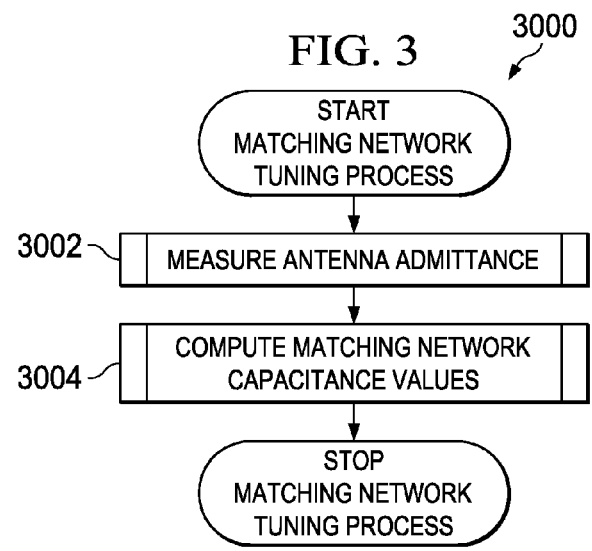
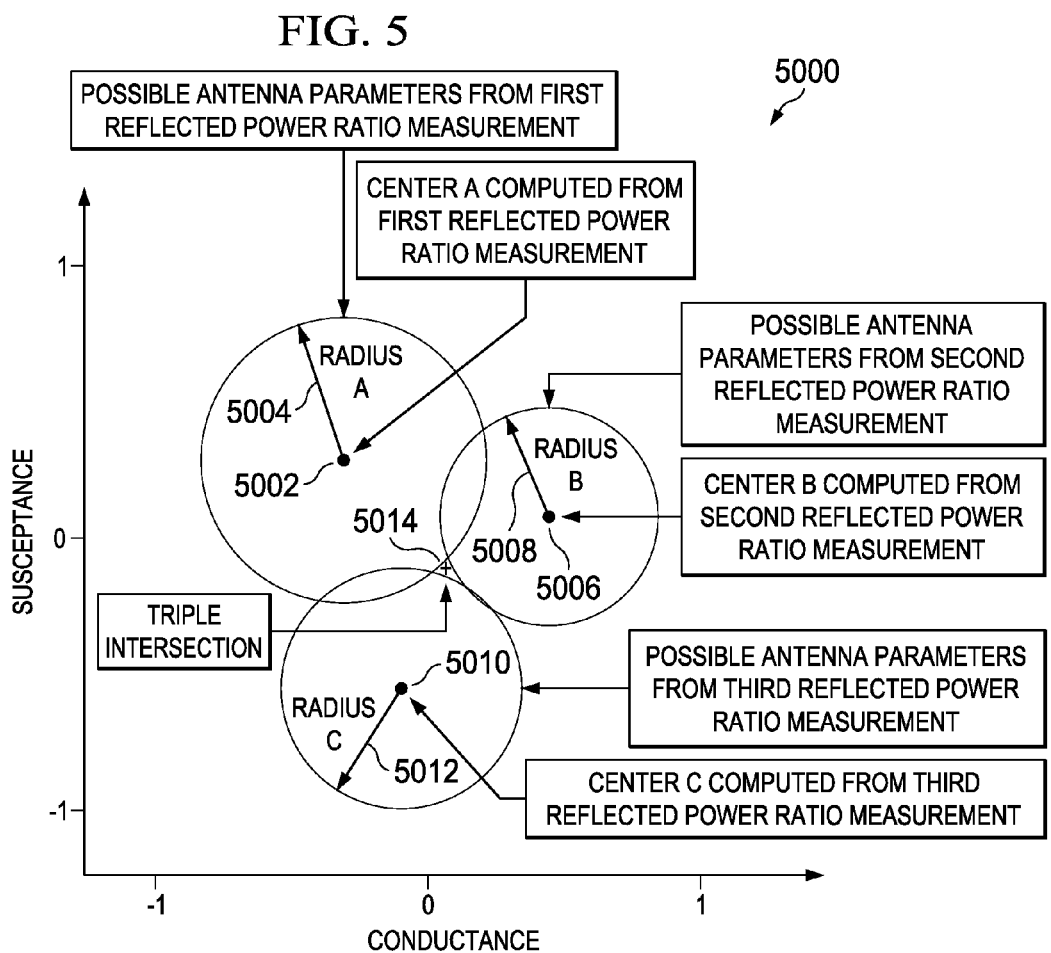

ANTENNA MATCHING NETWORK TUNING METHOD

This application claims the benefit of U.S. Provisional Application No. 61/373,273 filed Aug. 12, 2010, the entirety of which is incorporated herein by reference.

BACKGROUND

This relates to the field of radio frequency (RF) circuits and, more particularly, to matching networks in RF circuits.

An antenna of a radio frequency circuit may have varying admittance values, depending on the electrical environment around the antenna. Admittance has a complex numerical value consisting of a real conductance and an imaginary susceptance. For example, an antenna in a cellular phone may have one value of admittance when the cellular phone is held close to a human body and a different admittance value when the phone is on a table. The RF circuit may include a matching network between the antenna and another component, such as a transmission line, of the RF circuit coupled to the antenna. The matching network may reduce power losses due to reflected waves caused by an admittance mismatch between the antenna and the component coupled to the antenna. It may be desirable to tune the matching network so as to reduce the admittance mismatch as the antenna admittance varies. It may further be desirable to tune the matching network quickly and to employ low cost circuitry to perform the tuning.

SUMMARY

A matching network between an antenna and another component in an RF circuit may be tuned to reduce an admittance mismatch between the antenna and the other component by a two step process. The first step is to compute the admittance value of the antenna using measured reflected power ratios from at least three settings of the matching network. The second step is to identify capacitance values for tuning the matching network. A capacitance value for an antenna side shunt of the matching network is found by computing a target susceptance value for the antenna side shunt and comparing to a list of tuned antenna side susceptance values. The capacitance value of the tuned antenna side susceptance closest to the antenna side shunt target susceptance value is used to tune the antenna side shunt. A capacitance value for a circuit side shunt of the matching network is found by computing a target susceptance value for the circuit side shunt and comparing to a list of tuned circuit side susceptance values. The capacitance value of the tuned circuit side susceptance closest to the circuit side shunt target susceptance value is used to tune the circuit side shunt.

BRIEF DESCRIPTION OF THE DRAWINGS

FIG. 3 is a flow chart of a process for tuning a matching network in an RF circuit as described in reference to FIG. 1 and FIG. 2, according to an embodiment.

FIG. 5 is a chart of an admittance plane with VSWR circles from measurements of reflection coefficient magnitude values.

DETAILED DESCRIPTION OF EXAMPLE EMBODIMENTS

An RF circuit may have a matching network between an antenna and another component of the RF circuit, for example a transmission line. The transmission line example will be used for illustrative purposes herein; however, the same considerations will apply for another component that may be present in the RF circuit coupled to the matching network.

The matching network may have a "pi" configuration, with an antenna side shunt, a circuit side shunt, and a series element between the antenna side shunt and the circuit side shunt. The antenna side shunt may be tunable using a variable component, such as a variable capacitance in the antenna side shunt. Similarly, the circuit side shunt may be tunable using variable component, such as variable capacitance in the circuit side shunt. The matching network between the antenna and the transmission line may be tuned to reduce an admittance mismatch between the antenna and the transmission line by computing the admittance value of the antenna using measured reflected power ratios, followed by identifying capacitance values for tuning the matching network. A process for estimating an admittance of an RF component using a ladder network that may be utilized in connection with computing an admittance value of the antenna is described in U.S. Provisional Application No. 61/521,465 filed Aug. 8, 2011, the entirety of which is incorporated herein by reference.

Admittance values, represented by the variable y, are complex numbers. The real part of the admittance y is referred to as the conductance, represented by the variable g, and the imaginary part of the admittance y is referred to as the susceptance, represented by the variable b. This relationship may be expressed as:

$$y = g + jb; \quad (1)$$

where $j = \sqrt{-1}$.

Similarly, impedance values, represented by the variable z, are also complex numbers. The real part of the impedance z is referred to as the resistance, represented by the variable r, and the imaginary part of the impedance z is referred to as the reactance, represented by the variable x. This relationship may be expressed as:

$$z = r + jx. \quad (2)$$

Figure 1:
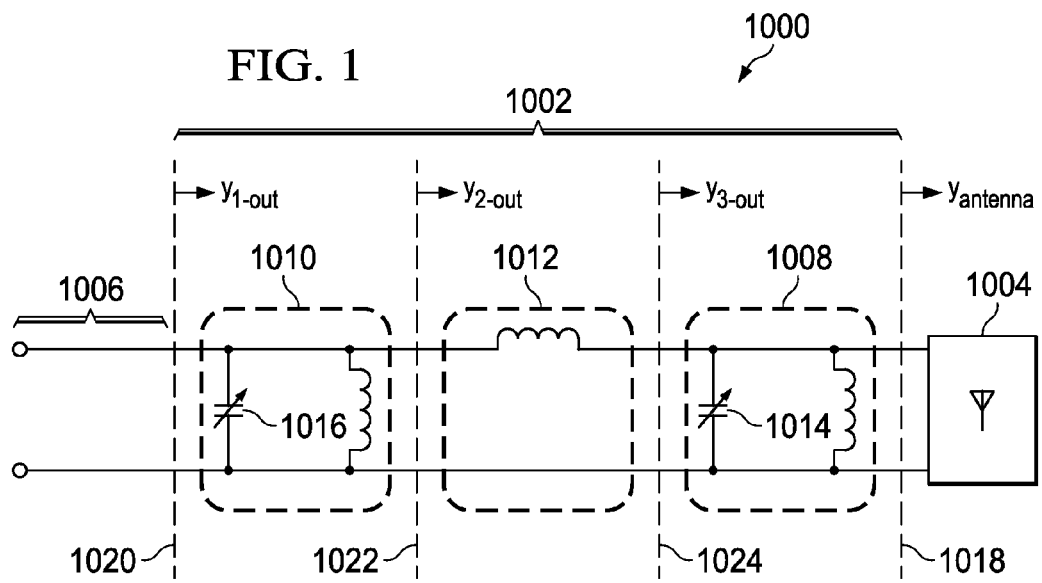
FIG. 1 is a circuit diagram according to an embodiment, with an antenna coupled to a tunable matching network in an RF circuit.

FIG. 1 is a circuit diagram according to an example embodiment, with an antenna coupled to a tunable matching network in an RF circuit 1000. The antenna 1004 is depicted in FIG. 1 as a single port component. The matching network 1002 is depicted in FIG. 1 as a two port component, coupled to the antenna 1004 at an antenna side port and coupled to the transmission line 1006 at a circuit side port. The matching network 1002 has a "pi" configuration with an antenna side shunt 1008 adjacent to the antenna side port, a circuit side shunt 1010 adjacent to the circuit side port, and a series element 1012 between the antenna side shunt 1008 and the circuit side shunt 1010. The antenna side shunt 1008 includes an antenna side variable capacitor 1014 which may be adjusted to any capacitance of a set of antenna side capacitances $C_{ant\_shunt,1}$, $C_{ant\_shunt,2}$, $C_{ant\_shunt,3}$, etc. The circuit side shunt 1010 includes a circuit side variable capacitor 1016 which may be adjusted to any capacitance of a set of circuit side capacitances $C_{ckt\_shunt,1}$, $C_{ckt\_shunt,2}$, $C_{ckt\_shunt,3}$, etc. The variable capacitors 1014 and 1016 may be adjusted, for example by a control circuit, not shown in FIG. 1. Capacitance values $C_{ant\_shunt,1}$, $C_{ant\_shunt,2}$, $C_{ant\_shunt,3}$, etc. of the antenna side variable capacitor 1014 and capacitance values $C_{ckt\_shunt,1}$, $C_{ckt\_shunt,2}$, $C_{ckt\_shunt,3}$, etc. of the circuit side variable capacitor 1016 are characterized prior to tuning the matching network 1002. The antenna side shunt 1008 and the circuit side shunt 1010 also include other reactive components, such as inductors as depicted in FIG. 1. The other reactive components are characterized prior to tuning the matching network 1002 so that admittance values of the antenna side shunt 1008 and the circuit side shunt 1010 may be estimated from each adjusted capacitance value of the variable capacitors 1014 and 1016. Specifically, for each capacitance $C_{ant\_shunt,1}$, $C_{ant\_shunt,2}$, $C_{ant\_shunt,3}$, etc., of the antenna side variable capacitor 1014, a corresponding antenna side susceptance $b_{ant\_shunt,1}$, $b_{ant\_shunt,2}$, $b_{ant\_shunt,3}$, etc., may be measured and/or estimated. Similarly, for each capacitance $C_{ckt\_shunt,1}$, $C_{ckt\_shunt,2}$, $C_{ant\_shunt,3}$, etc., of the circuit side variable capacitor 1016, a corresponding circuit side susceptance $b_{ckt\_shunt,1}$, $b_{ckt\_shunt,2}$, $b_{ckt\_shunt,3}$, etc., may be measured and/or estimated. The series element 1012 has a complex impedance $z_2$, with a reactance $x_2$, which is also characterized prior to tuning the matching network 1002.

An antenna admittance $y_{antenna}$ may be defined looking into an antenna reference plane 1018 in the direction indicated as $y_{antenna}$. The antenna admittance $y_{antenna}$ has an antenna conductance $g_{antenna}$, and an antenna susceptance $b_{antenna}$.

Three network admittances may be defined at three reference planes in the matching network 1002. A first network admittance $y_{1-out}$ may be defined at a first reference plane 1020 between the transmission line 1006 and the circuit side shunt 1010. The first network admittance $y_{1-out}$ has a conductance $g_{1-out}$ and a susceptance $b_{1-out}$. A second network admittance $y_{2-out}$ may be defined at a second reference plane 1022 between the circuit side shunt 1010 and the series element 1012. The second network admittance $y_{2-out}$ has a conductance $g_{2-out}$ and a susceptance $b_{2-out}$. A third network admittance $y_{3-out}$ may be defined at a third reference plane 1024 between the series element 1012 and the antenna side shunt 1008. The third network admittance $y_{3-out}$ has a conductance $g_{3-out}$ and a susceptance $b_{3-out}$.

Figure 2:
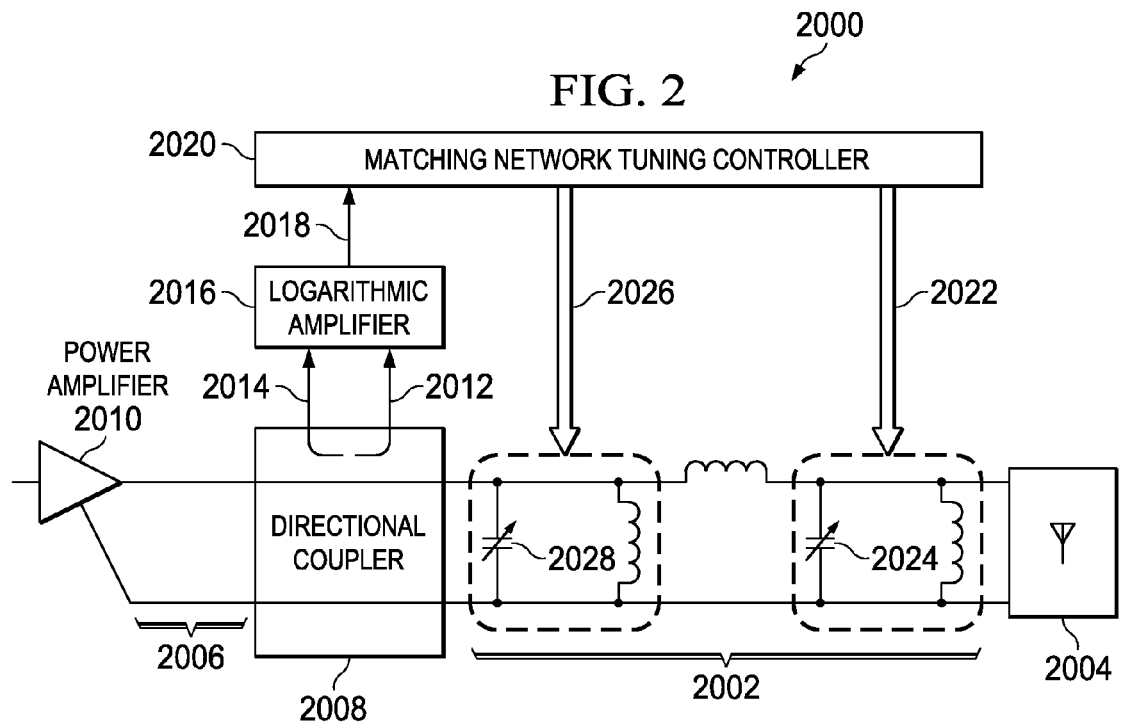
FIG. 2 depicts an example circuit for tuning a matching network according to an embodiment.

FIG. 2 depicts an example circuit for tuning a matching network according to an example embodiment. The circuit 2000 has a matching network 2002 as described in reference to FIG. 1 connected to an antenna 2004 at an antenna side port of the matching network 2002. The matching network 2002 is coupled to a directional coupler 2008 at a circuit side port of the matching network 2002. The directional coupler 2008 is coupled to a transmission line 2006. The transmission line 2006 is connected to a power amplifier 2010, which provides a forward RF signal to the matching network 2002. The directional coupler 2008 provides a sample 2012 of the forward RF signal and provides a sample 2014 of a reverse RF signal from the circuit side port of the matching network 2002. The forward RF signal sample 2012 and the reverse RF signal sample 2014 are provided to a logarithmic amplifier 2016 which provides a logarithmic signal 2018 that is proportional to a logarithm of a magnitude of the reverse RF signal sample 2014 divided by a magnitude of the forward RF signal sample 2012. The logarithmic signal 2018 is provided to a matching network tuning controller 2020 which computes a reflection coefficient magnitude $|\Gamma|$ which is the absolute value of the ratio of the magnitude of the reverse RF signal sample 2014 divided by the magnitude of the forward RF signal sample 2012. The matching network tuning controller 2020 uses the logarithmic signal 2018 to provide an antenna side tuning signal 2022 to an antenna side variable capacitor 2024 in the matching network 2002, and to provide a circuit side tuning signal 2026 to a circuit side variable capacitor 2028 in the matching network 2002.

FIG. 3 is a flow chart of an example process for tuning a matching network in an RF circuit as described in reference to FIGS. 1 and 2. The process 3000 begins in step 3002 with measuring an admittance of an antenna in the RF circuit connected to an antenna side port of the matching network. Subsequently, in step 3004, the measured antenna admittance is used to compute capacitance values for variable capacitors in an antenna side shunt and in a circuit side shunt of the matching network. In one version of the instant embodiment, the matching network may be further tuned after execution of step 3004 by other tuning methods, such as incremental adjustments based on reflected power measurements.

Figure 4:
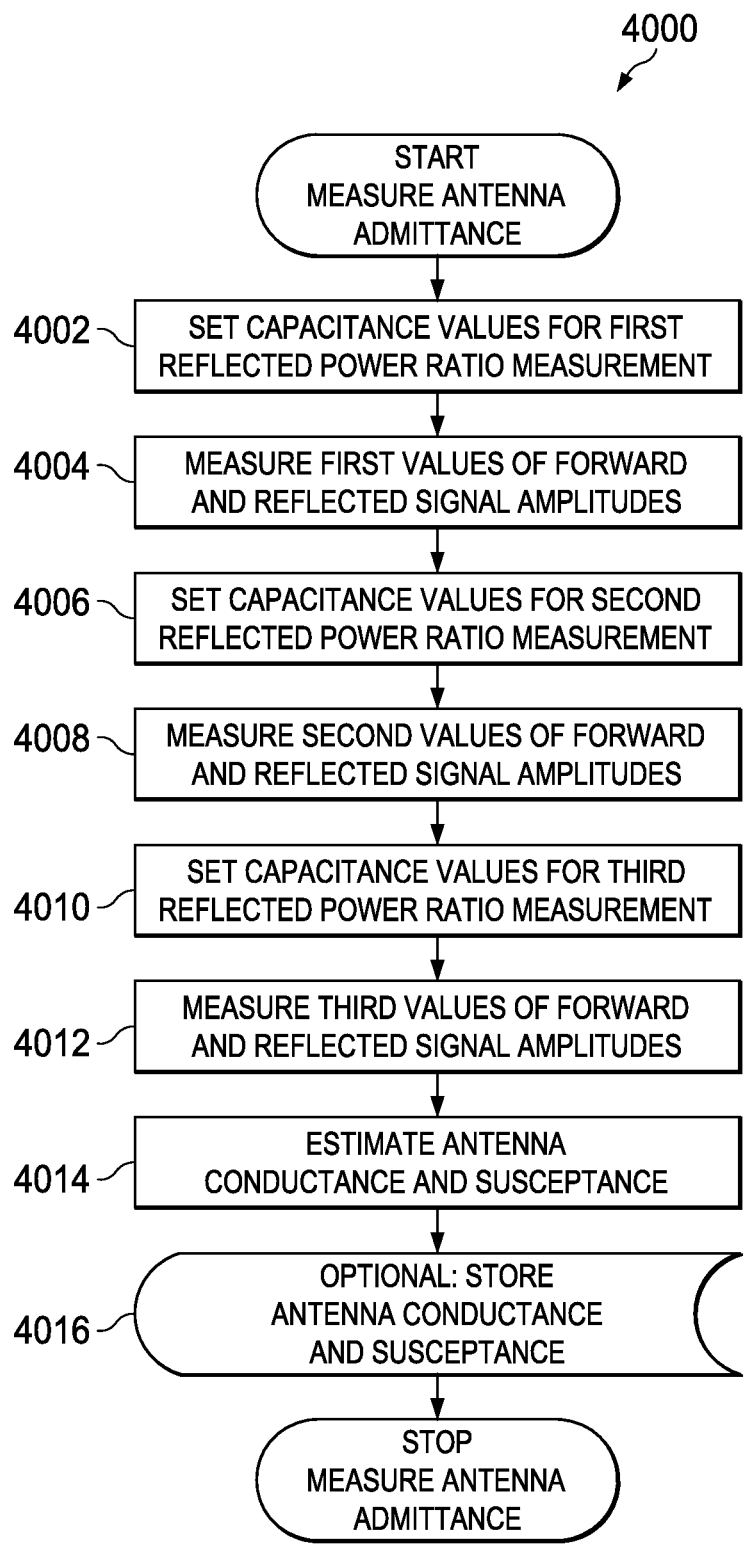
FIG. 4 is a flow chart of a process for measuring an admittance value for an antenna in the RF circuit as described in reference to FIG. 2, according to an embodiment.

FIG. 4 is a flow chart of a process for measuring an admittance value for an antenna in the RF circuit as described in reference to FIG. 2. The process 4000 begins with step 4002 in which the circuit side variable capacitor 2028 of FIG. 2 is set to a first circuit side capacitance value $C_{ckt\_shunt,A}$ and the antenna side variable capacitor 2024 of FIG. 2 is set to a first antenna side capacitance value $C_{ant\_shunt,A}$ for measuring a first value of the reflection coefficient magnitude. The circuit side shunt has a susceptance value $b_{ckt\_shunt,A}$ and the antenna side shunt has a susceptance value $b_{ant\_shunt,A}$. In one implementation, the first circuit side capacitance value $C_{ckt\_shunt,A}$ may be a minimum of the set of circuit side capacitances $C_{ckt\_shunt,1}$, $C_{ckt\_shunt,2}$, $C_{ckt\_shunt,3}$, etc., and the first antenna side capacitance value $C_{ant\_shunt,A}$ may be a minimum of the set of antenna side capacitances $C_{ant\_shunt,1}$, $C_{ant\_shunt,2}$, $C_{ant\_shunt,3}$, etc. described in reference to FIG. 1.

Subsequently, in step 4004, a first value $|\Gamma_A|$ is measured of the reflection coefficient magnitude which is an absolute value of a ratio of a forward signal amplitude to a reverse signal amplitude, as described in reference to FIG. 2. The value of $|\Gamma_A|$ may be stored for subsequent use in computation of the admittance value of the antenna.

In step 4006, the circuit side variable capacitor 2028 is set to a second circuit side capacitance value $C_{ckt\_shunt,B}$ and the antenna side variable capacitor 2024 is set to a second antenna side capacitance value $C_{ant\_shunt,B}$ for measuring a second value of the reflection coefficient magnitude. The circuit side shunt has a susceptance value $b_{ckt\_shunt,B}$ and the antenna side shunt has a susceptance value $b_{ant\_shunt,B}$. In one implementation, the second circuit side capacitance value $C_{ckt\_shunt,B}$ may be at or near the minimum of the set of circuit side capacitances $C_{ckt\_shunt,1}$, $C_{ckt\_shunt,2}$, $C_{ckt\_shunt,3}$, etc., and the second antenna side capacitance value $C_{ant\_shunt,B}$ may be at or near an average value of the set of antenna side capacitances $C_{ant\_shunt,1}$, $C_{ant\_shunt,2}$, $C_{ant\_shunt,3}$, etc.

Subsequently, in step 4008, a second value $|\Gamma_B|$ of the reflection coefficient magnitude is measured. The value of $|\Gamma_B|$ may be stored for subsequent use in computation of the admittance value of the antenna.

In step 4010, the circuit side variable capacitor 2028 is set to a third circuit side capacitance value $C_{ckt\_shunt,C}$ and the antenna side variable capacitor 2024 is set to a third antenna side capacitance value $C_{ant\_shunt,C}$ for measuring a third value of the reflection coefficient magnitude. The circuit side shunt has a susceptance value $b_{ckt\_shunt,C}$ and the antenna side shunt has a susceptance value $b_{ant\_shunt,C}$. In one version of the instant embodiment, the third circuit side capacitance value $C_{ckt\_shunt,C}$ may be at or near an average value of the set of circuit side capacitances $C_{ckt\_shunt,1}$, $C_{ckt\_shunt,2}$, $C_{ckt\_shunt,3}$, etc., and the third antenna side capacitance value $C_{ant\_shunt,B}$ may be at or near the minimum of the set of antenna side capacitances $C_{ant\_shunt,1}$, $C_{ant\_shunt,2}$, $C_{ant\_shunt,3}$, etc. In another implementation, the third circuit side capacitance value $C_{ckt\_shunt,C}$ may be at or near the average value of the set of circuit side capacitances $C_{ckt\_shunt,1}$, $C_{ckt\_shunt,2}$, $C_{ckt\_shunt,3}$, etc., and the third antenna side capacitance value $C_{ant\_shunt,B}$ may be at or near the average value of the set of antenna side capacitances $C_{ant\_shunt,1}$, $C_{ant\_shunt,2}$, $C_{ant\_shunt,3}$, etc.

Subsequently, in step 4012, a third value $|\Gamma_C|$ of the reflection coefficient magnitude is measured. The value of $|\Gamma_C|$ may be stored for subsequent use in computation of the admittance value of the antenna.

It will be appreciated that values of the circuit side capacitance and the antenna side capacitance may be interchanged among the three measurements of the reflection coefficient magnitude. In an alternate implementation, additional iterations of setting the circuit side variable capacitor 2028 and the antenna side variable capacitor 2024 and making measurements of the reflection coefficient magnitude may be executed, and three values of the reflection coefficient magnitude may be selected for estimating the antenna conductance and susceptance. For example, the circuit side variable capacitor 2028 may be set to a fourth circuit side capacitance value $C_{ckt\_shunt,D}$ and the antenna side variable capacitor 2024 set to a fourth antenna side capacitance value $C_{ant\_shunt,D}$, and a fourth value $|\Gamma_D|$ of the reflection coefficient magnitude measured. The lowest three of the four values $|\Gamma_A|$, $|\Gamma_B|$, $|\Gamma_C|$ and $|\Gamma_D|$ may then be selected for estimating the antenna conductance and susceptance.

After the three values $|\Gamma_A|$, $|\Gamma_B|$ and $|\Gamma_C|$ of the reflection coefficient magnitude have been measured, step 4014 is executed to estimate the antenna conductance and susceptance. First, three values of voltage standing wave ratio (VSWR) are computed from the three values $|\Gamma_A|$, $|\Gamma_B|$ and $|\Gamma_C|$ of the reflection coefficient magnitude according to the following formulae:

$$V_A = \frac{1+|\Gamma_A|}{1-|\Gamma_A|}; \tag{3}$$

$$V_B = \frac{1+|\Gamma_B|}{1-|\Gamma_B|}; \text{ and} \tag{4}$$

$$V_C = \frac{1+|\Gamma_C|}{1-|\Gamma_C|}. \tag{5}$$

Determining the antenna conductance and susceptance from the three measurements of the reflection coefficient magnitude may be visualized as determining coordinates of a triple intersection of three VSWR circles defined by the three measurements of the reflection coefficient magnitude, as shown in FIG. 5. FIG. 5 illustrates a graph 5000 in an admittance plane in which horizontal coordinates are conductance values and vertical coordinates are susceptance values. For each measurement of the reflection coefficient magnitude, a VSWR circle may be computed in the admittance plane for which possible values of the antenna conductance and susceptance, consistent with the measurement, lie on a circumference of the VSWR circle. The first reflection coefficient measurement defines a first VSWR circle with a first center 5002 and a first radius 5004, the second reflection coefficient measurement defines a second VSWR circle with a second center 5006 and a second radius 5008, and the third reflection coefficient measurement defines a third VSWR circle with a third center 5010 and a third radius 5012. Actual values of the antenna conductance and susceptance are estimated from coordinates of the triple intersection 5014 of the three VSWR circles. A coordinate value corresponding to an admittance value in the admittance plane of FIG. 5 is represented by a complex number in which a horizontal coordinate value corresponding to a conductance value of the admittance value is a real part of the complex number and a vertical coordinate value corresponding to a susceptance value of the admittance value is an imaginary part of the complex number.

Returning to step 4014, coordinates of the three centers 5002, 5006 and 5010 are computed using the formulae:

$$C_A = \frac{\frac{V_A^2+1}{2V_A} - j\left(\frac{1}{x_2} - b_{ckt\_shunt,A}\right)}{x_2^2\left(1+\left(\frac{1}{x_2} - b_{ant\_shunt,A}\right)^2\right)} + j\left(\frac{1}{x_2} - b_{ant\_shunt,A}\right); \tag{6}$$

$$C_B = \frac{\frac{V_B^2+1}{2V_B} - j\left(\frac{1}{x_2} - b_{ckt\_shunt,B}\right)}{x_2^2\left(1+\left(\frac{1}{x_2} - b_{ant\_shunt,B}\right)^2\right)} + j\left(\frac{1}{x_2} - b_{ant\_shunt,B}\right); \tag{7}$$

and $$C_C = \frac{\frac{V_C^2+1}{2V_C} - j\left(\frac{1}{x_2} - b_{ckt\_shunt,C}\right)}{x_2^2\left(1+\left(\frac{1}{x_2} - b_{ant\_shunt,C}\right)^2\right)} + j\left(\frac{1}{x_2} - b_{ant\_shunt,C}\right). \tag{8}$$

Coordinates of corresponding radii 5004, 5008 and 5012 of the three circles are computed using the formulae:

$$R_A = \frac{\frac{V_A^2-1}{2V_A}}{x_2^2\left(1+\left(\frac{1}{x_2} - b_{ckt\_shunt,A}\right)^2\right)}; \tag{9}$$

$$R_B = \frac{\frac{V_B^2-1}{2V_B}}{x_2^2\left(1+\left(\frac{1}{x_2} - b_{ckt\_shunt,B}\right)^2\right)}; \text{ and} \tag{10}$$

$$R_C = \frac{\frac{V_C^2-1}{2V_C}}{x_2^2\left(1+\left(\frac{1}{x_2} - b_{ckt\_shunt,C}\right)^2\right)}. \tag{11}$$

Coordinates $(x_{int}, y_{int})$ of the triple intersection 5014 may be computed by any of various methods. For example, a trilateration procedure may be used. In a trilateration procedure, values for intermediate parameters d, p, and q are computed using the formulae:

$$d = \sqrt{(\text{Re}(C_B - C_A))^2 + (\text{Im}(C_B - C_A))^2}; \tag{12}$$

$$p = \frac{(\text{Re}(C_B - C_A) \times \text{Re}(C_C - C_A)) + (\text{Im}(C_B - C_A) \times \text{Im}(C_C - C_A))}{d}; \text{ and} \tag{13}$$

-continued $$q = \frac{(\text{Im}(C_B - C_A) \times \text{Re}(C_C - C_A)) - (\text{Re}(C_B - C_A) \times \text{Im}(C_C - C_A))}{d}. \quad (14)$$

Then, the coordinates $(x_{int}, y_{int})$ may be computed using the formulae:

$$x_{int} = \frac{R_A^2 - R_B^2 + d^2}{2d}; \text{ and} \quad (15)$$

$$y_{int} = \frac{R_A^2 - R_A^2 + p^2 + q^2}{2q} - \frac{p(R_A^2 - R_B^2 + d^2)}{2qd}. \quad (16)$$

After the coordinates $(x_{int}, y_{int})$ are computed, the antenna conductance $g_{ant}$ and susceptance $b_{ant}$ may be computed using the formulae:

$$g_{ant} = \frac{(x_{int} \times \text{Re}(C_B - C_A)) + (y_{int} \times \text{Im}(C_B - C_A)) + \text{Re}(C_A)}{\sqrt{(\text{Re}(C_B - C_A))^2 + (\text{Im}(C_B - C_A))^2}}; \quad (17)$$

$$b_{ant} = \frac{(x_{int} \times \text{Im}(C_B - C_A)) - (y_{int} \times \text{Re}(C_B - C_A)) + \text{Im}(C_A)}{\sqrt{(\text{Re}(C_B - C_A))^2 + (\text{Im}(C_B - C_A))^2}}. \quad (18)$$

Figure 6:
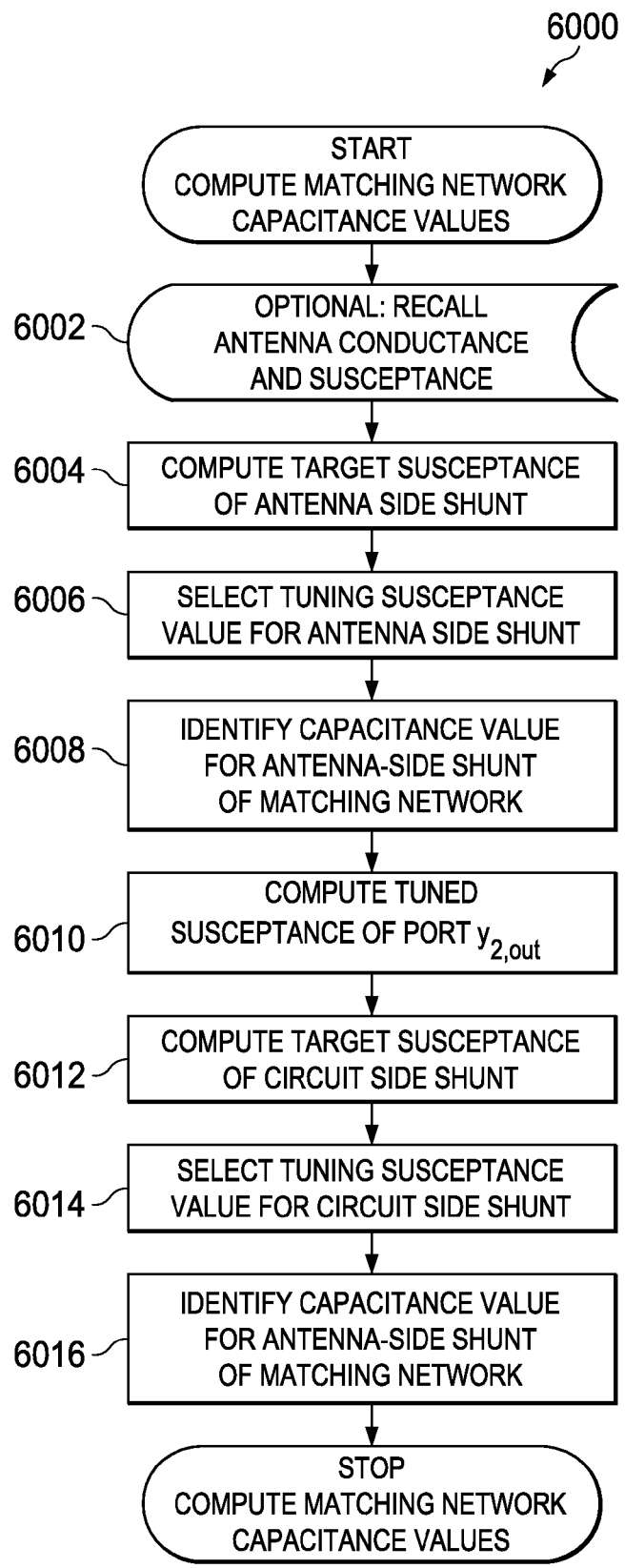
FIG. 6 is a flowchart of a process for computing capacitance values for variable capacitors in an antenna side shunt and in a circuit side shunt of a matching network in an RF circuit as described in reference to FIG. 2, according to an embodiment.

FIG. 6 is a flowchart of a example process for computing capacitance values for variable capacitors in an antenna side shunt and in a circuit side shunt of a matching network in an RF circuit as described in reference to FIG. 2. The process 6000 may begin with optional step 6002 which is to recall stored values of an antenna conductance $g_{antenna}$ and antenna susceptance $b_{antenna}$. Subsequently, step 6004 is executed, in which a target susceptance $b_{ant\_shunt,tgt}$ of the antenna side shunt is computed, according to these formulae:

$$b_{3-out,tgt} = \frac{1}{x_2} - \sqrt{\left(\frac{1}{2x_2^2}\right)^2 - \left(g_{antenna} - \frac{1}{2x_2^2}\right)^2} \quad (19)$$

if $0 < g_{antenna} < \frac{1}{x_2^2}$;

or $$b_{3-out,tgt} = \frac{1}{x_2} \text{ if } g_{antenna} > \frac{1}{x_2^2}; \text{ and} \quad (20)$$

$$b_{ant\,shunt,tgt} = b_{3-out,tgt} - b_{antenna}; \quad (21)$$

where $x_2$ is the reactance of the series element between the antenna side shunt and the circuit side shunt.

Next, step 6006 is executed, in which possible susceptance values of the antenna side shunt $b_{ant\_shunt,1}$, $b\_ant_{\_shunt,2}$, $b_{ant\_shunt,3}$, etc., corresponding to possible capacitance values $C_{ant\_shunt,1}$, $C_{ant\_shunt,2}$, $C_{ant\_shunt,3}$, etc., of an antenna side variable capacitor in the antenna side shunt, are compared to the target susceptance $b_{ant\_shunt,tgt}$ and an antenna side susceptance value of the $b_{ant\_shunt,1}$, $b_{ant\_shunt,2}$, $b_{ant\_shunt,3}$, etc., closest to the target susceptance $b_{ant\_shunt,tgt}$ is identified. The identified antenna side susceptance value is hereafter referred to as tuned susceptance $b_{ant\_shunt,tune}$. Step 6006 may be executed, for example, using a look-up table, binary search algorithm, and/or a circuit model of the antenna side shunt.

Subsequently, step 6008 is executed, in which a tuned capacitance value $C_{ant\_shunt,tune}$ of the antenna side variable capacitor corresponding to the tuned susceptance $b_{ant\_shunt,tune}$ is identified. Step 6008 may be performed for example using a look-up table, and/or a circuit model of the antenna side shunt.

Next, step 6010 is executed, which is to compute a tuned susceptance value $b_{2-out,tune}$ at the second reference plane between the circuit side shunt and the series element of the matching network, using the tuned susceptance $b_{ant\_shunt,tune}$. The tuned susceptance value $b_{2-out,tune}$ is computed using this formula:

$$b_{2-out,tune} = \text{Im}\left(\frac{g_{antenna} + j(b_{antenna} + b_{ant\,shunt,tune})}{1 + jx_2(g_{antenna} + j(b_{antenna} + b_{ant\,shunt,tune}))}\right); \quad (22)$$

where the function Im provides the imaginary part of its complex argument

Subsequently, step 6012 is executed, in which a target susceptance $b_{ckt\_shunt,tgt}$ of the circuit side shunt is computed, according to this formula:

$$b_{ckt\_shunt,tgt} = -b_{2-out,tune}. \quad (23)$$

Next, step 6014 is executed, in which possible susceptance values of the circuit side shunt $b_{ckt\_shunt,1}$, $b_{ckt\_shunt,2}$, $b_{ckt\_shunt,3}$, etc., corresponding to possible capacitance values $C_{ckt\_shunt,1}$, $C_{ckt\_shunt,2}$, $C_{ckt\_shunt,3}$, etc. of a circuit side variable capacitor in the circuit side shunt, are compared to the target susceptance $b_{ckt\_shunt,tgt}$ and a circuit side susceptance value of the $b_{ckt\_shunt,1}$, $b_{ckt\_shunt,2}$, $b_{ckt\_shunt,3}$, etc. closest to the target susceptance $b_{ckt\_shunt,tgt}$ is identified. The identified circuit side susceptance value is hereafter referred to as tuned susceptance $b_{ckt\_shunt,tune}$. Step 6014 may be executed for example using a look-up table, binary search algorithm, and/or a circuit model of the antenna side shunt.

Subsequently, step 6016 is executed, in which a tuned capacitance value $C_{ckt\_shunt,tune}$ of the circuit side variable capacitor corresponding to the tuned susceptance $b_{ckt\_shunt,tune}$ is identified. Step 6016 may be performed for example using a look-up table, and/or a circuit model of the circuit side shunt.

Those skilled in the art will appreciate that other embodiments and variations are possible within the scope of the claimed invention.

What is claimed is:

1. A method of setting capacitance values for a matching network having a pi configuration, comprising steps:

using a controller circuit coupled to said matching network, computing a target susceptance $b_{ant\_shunt,tgt}$ of an antenna side shunt of said matching network, said antenna side shunt including an antenna side variable capacitor, using the formula:

$$b_{3-out,target} = \frac{1}{x_2} - \sqrt{\left(\frac{1}{2x_2^2}\right)^2 - \left(g_{antenna} - \frac{1}{2x_2^2}\right)^2}$$

if $0 < g_{antenna} < \frac{1}{x_2^2}$ or $$b_{3-out,target} = \frac{1}{x_2} \text{ if } g_{antenna} > \frac{1}{x_2^2}, \text{ and}$$

$$b_{ant\,shunt,target} = b_{3-out,target} - b_{antenna};$$

where:
- $g_{antenna}$ and $b_{antenna}$ are a conductance and susceptance, respectively, of an antenna coupled to said matching network at said antenna side shunt, and
- $x_2$ is a reactance of a series element of said matching network between said antenna side shunt and a circuit side shunt of said matching network;

using said controller circuit, identifying a tuned susceptance of said antenna side shunt from a list of possible susceptance values of said antenna side shunt corresponding to possible capacitance values of said antenna side variable capacitor such that said tuned susceptance of said antenna side shunt is closest to said target susceptance of said antenna side shunt;

using said controller circuit, identifying a capacitance value of said antenna side variable capacitor which corresponds to said tuned susceptance of said antenna side shunt;

using said controller circuit, computing a tuned susceptance value $b_{2-out,tune}$ at a reference plane in said matching network between said series element and said circuit side shunt, using the formula:

$$b_{2-out,tune} = \text{Im}\left(\frac{g_{antenna} + j(b_{antenna} + b_{ant\,shunt,tune})}{1 + jx_2(g_{antenna} + j(b_{antenna} + b_{ant\,shunt,tune}))}\right);$$

using said controller circuit, computing a target susceptance $b_{ckt\_shunt,tgt}$ of said circuit side shunt, using the formula:

$$b_{ckt\_shunt,target} = -b_{2-out,tune};$$

using said controller circuit, identifying a tuned susceptance of said circuit side shunt from a list of possible susceptance values of said circuit side shunt corresponding to possible capacitance values of a circuit side variable capacitor of said circuit side shunt, such that said tuned susceptance of said circuit side shunt is closest to said target susceptance of said circuit side shunt;

using said controller circuit, identifying a tuned capacitance value of said circuit side variable capacitor which corresponds to said tuned susceptance of said circuit side shunt; and using said controller circuit, setting said circuit side variable capacitor to said tuned capacitance value.

2. The process of claim 1, further including a step of recalling stored values of said $g_{antenna}$ and $b_{antenna}$ prior to said step of computing said target susceptance $b_{ant\_shunt,tgt}$.

3. The process of claim 1, in which:
said step of identifying said tuned susceptance of said antenna side shunt is performed using a look-up table of said possible susceptance values of said antenna side shunt; and
said step of identifying said tuned susceptance of said circuit side shunt is performed using a look-up table of said possible susceptance values of said circuit side shunt.

4. The process of claim 1, in which:
said step of identifying said tuned susceptance of said antenna side shunt is performed using a circuit model of said antenna side shunt; and
said step of identifying said tuned susceptance of said circuit side shunt is performed using a circuit model of said circuit side shunt.

5. A process of determining an admittance of an antenna for tuning a matching network coupled to said antenna, comprising steps:

setting a circuit side variable capacitor of a circuit side shunt of said matching network to a first circuit side capacitance value $C_{ckt\_shunt,A}$, so that said circuit side shunt has a susceptance $b_{ckt\_shunt,A}$, said matching network having a pi configuration and being coupled to said antenna;

setting an antenna side variable capacitor of an antenna side shunt of said matching network to a first antenna side capacitance value $C_{ant\_shunt,A}$, so that said antenna side shunt has a susceptance $b_{ant\_shunt,A}$;

using a controller circuit coupled to said matching network, computing a first value $|\Gamma_A|$ of a reflection coefficient magnitude at said circuit side shunt with said first circuit side and antenna side capacitance value settings;

setting said circuit side variable capacitor to a second circuit side capacitance value $C_{ckt\_shunt,B}$, so that said circuit side shunt has a susceptance $b_{ckt\_shunt,B}$;

setting said antenna side variable capacitor to a second antenna side capacitance value $C_{ant\_shunt,B}$, so that said antenna side shunt has a susceptance $b_{ant-shunt,B}$;

using said controller circuit, computing a second value $|\Gamma_B|$ of said reflection coefficient magnitude at said circuit side shunt with said second circuit side and antenna side capacitance value settings;

setting said circuit side variable capacitor to a third circuit side capacitance value $C_{ckt\_shunt,C}$, so that said circuit side shunt has a susceptance $b_{ckt\_shunt,C}$;

setting said antenna side variable capacitor to a third antenna side capacitance value $C_{ant\_shunt,C}$, so that said antenna side shunt has a susceptance $b_{ant\_shunt,C}$;

using said controller circuit, computing a third value $|\Gamma_C|$ of said reflection coefficient magnitude at said circuit side shunt with said third circuit side and antenna side capacitance value settings;

computing three values of voltage standing wave ratio from said values $|\Gamma_A|$, $|\Gamma_B|$ and $|\Gamma_C|$, respectively, using the formulae:

$$V_A = \frac{1 + |\Gamma_A|}{1 - |\Gamma_A|},$$

$$V_B = \frac{1 + |\Gamma_B|}{1 - |\Gamma_B|}, \text{ and}$$

$$V_C = \frac{1 + |\Gamma_C|}{1 - |\Gamma_C|};$$

computing coordinates of centers of three voltage standing wave ratio (VSWR) circles in an admittance plane, using the formulae:

$$C_A = \frac{\frac{V_A^2 + 1}{2V_A} - j\left(\frac{1}{x_2} - b_{ckt\_shunt,A}\right)}{x_2^2\left(1 + \left(\frac{1}{x_2} - b_{ant\_shunt,A}\right)^2\right)} + j\left(\frac{1}{x_2} - b_{ant\_shunt,A}\right),$$

$$C_B = \frac{\frac{V_B^2 + 1}{2V_B} - j\left(\frac{1}{x_2} - b_{ckt\_shunt,B}\right)}{x_2^2\left(1 + \left(\frac{1}{x_2} - b_{ant\_shunt,B}\right)^2\right)} + j\left(\frac{1}{x_2} - b_{ant\_shunt,B}\right), \text{ and}$$

-continued $$C_C = \frac{\frac{V_C^2+1}{2V_C} - j\left(\frac{1}{x_2} - b_{ckt\_shunt,C}\right)}{x_2^2\left(1 + \left(\frac{1}{x_2} - b_{ant\_shunt,C}\right)^2\right)} + j\left(\frac{1}{x_2} - b_{ant\_shunt,C}\right);$$

computing radii of said three VSWR circles, using the formulae:

$$R_A = \frac{\frac{V_A^2-1}{2V_A}}{x_2^2\left(1 + \left(\frac{1}{x_2} - b_{ckt\_shunt,A}\right)^2\right)},$$

$$R_B = \frac{\frac{V_B^2-1}{2V_B}}{x_2^2\left(1 + \left(\frac{1}{x_2} - b_{ckt\_shunt,B}\right)^2\right)}, \text{ and}$$

$$R_C = \frac{\frac{V_C^2-1}{2V_C}}{x_2^2\left(1 + \left(\frac{1}{x_2} - b_{ckt\_shunt,C}\right)^2\right)};$$

computing coordinates ($x_{int}$, $y_{int}$) of a triple intersection of said three VSWR circles;
computing an antenna conductance $g_{ant}$ and an antenna susceptance $b_{ant}$ of said antenna admittance, using the formulae:

$$g_{ant} = \frac{(x_{int} \times \text{Re}(C_B - C_A)) + (y_{int} \times \text{Im}(C_B - C_A)) + \text{Re}(C_A)}{\sqrt{(\text{Re}(C_B - C_A))^2 + (\text{Im}(C_B - C_A))^2}}, \text{ and}$$

$$b_{ant} = \frac{(x_{int} \times \text{Im}(C_B - C_A)) - (y_{int} \times \text{Re}(C_B - C_A)) + \text{Im}(C_A)}{\sqrt{(\text{Re}(C_B - C_A))^2 + (\text{Im}(C_B - C_A))^2}}; \text{ and}$$

using said controller circuit, setting tuned values of said circuit side and antenna side variable capacitors responsive to said computed antenna conductance and antenna susceptance.

6. The process of claim 5, in which said coordinates ($x_{int}$, $y_{int}$) of said triple intersection of said three VSWR circles are computed by a process including steps:
computing intermediate formulae d, p and q, using the formulae:

$$d = \sqrt{(\text{Re}(C_B - C_A))^2 + (\text{Im}(C_B - C_A))^2},$$

$$p = \frac{(\text{Re}(C_B - C_A) \times \text{Re}(C_C - C_A)) + (\text{Im}(C_B - C_A) \times \text{Im}(C_C - C_A))}{d},$$

and $$q = \frac{(\text{Im}(C_B - C_A) \times \text{Re}(C_C - C_A)) - (\text{Re}(C_B - C_A) \times \text{Im}(C_C - C_A))}{d}; \text{ and}$$

computing said coordinates ($x_{int}$, $y_{int}$) of said triple intersection using the formulae:

$$x_{int} = \frac{R_A^2 - R_B^2 + d^2}{2d}, \text{ and}$$

-continued $$y_{int} = \frac{R_A^2 - R_A^2 + p^2 + q^2}{2q} - \frac{p(R_A^2 - R_B^2 + d^2)}{2qd}.$$

7. The process of claim 5, further including the step of storing the computed values of said antenna conductance $g_{ant}$ and said antenna susceptance $b_{ant}$.

8. The process of claim 5, in which:
said first circuit side capacitance value $C_{ckt\_shunt,A}$ is a minimum of a set of circuit side capacitances; and
said first antenna side capacitance value $C_{ant\_shunt,A}$ is a minimum of a set of antenna side capacitances.

9. The process of claim 5, in which:
said second circuit side capacitance value $C_{ckt\_shunt,B}$ is at or near a minimum of a set of circuit side capacitances; and
said second antenna side capacitance value $C_{ant\_shunt,B}$ is at or near an average value of a set of antenna side capacitances.

10. The process of claim 5, in which:
said third circuit side capacitance value $C_{ckt\_shunt,B}$ is at or near an average value of a set of circuit side capacitances; and
said third antenna side capacitance value $C_{ant\_shunt,B}$ is at or near a minimum of a set of antenna side capacitances.

11. The process of claim 5, in which:
said third circuit side capacitance value $C_{ckt\_shunt,B}$ is at or near an average value of a set of circuit side capacitances; and
said third antenna side capacitance value $C_{ant\_shunt,B}$ is at or near an average value of a set of antenna side capacitances.

12. A process of tuning a matching network having a pi configuration and being coupled to an antenna, comprising steps:
setting a circuit side variable capacitor of a circuit side shunt of a matching network to a first circuit side capacitance value $C_{ckt\_shunt,A}$, so that said circuit side shunt has a susceptance $b_{ckt\_shunt,A}$, said matching network having a pi configuration, coupled to said antenna;
setting an antenna side variable capacitor of an antenna side shunt of said matching network to a first antenna side capacitance value $C_{ant\_shunt,A}$, so that said antenna side shunt has a susceptance $b_{ant\_shunt,A}$;
measuring a first value $|\Gamma_A|$ of a reflection coefficient magnitude at said circuit side shunt with said first circuit side and antenna side capacitance settings;
setting said circuit side variable capacitor to a second circuit side capacitance value $C_{ckt\_shunt,B}$, so that said circuit side shunt has a susceptance $b_{ckt\_shunt,B}$;
setting said antenna side variable capacitor to a second antenna side capacitance value $C_{ant\_shunt,B}$, so that said antenna side shunt has a susceptance $b_{ant\_shunt,B}$;
measuring a second value $|\Gamma_B|$ of a reflection coefficient magnitude at said circuit side shunt;
setting said circuit side variable capacitor to a third circuit side capacitance value $C_{ckt\_shunt,C}$, so that said circuit side shunt has a susceptance $b_{ckt\_shunt,C}$;
setting an antenna side variable capacitor to a third antenna side capacitance value $C_{ant\_shunt,C}$, so that said antenna side shunt has a susceptance $b_{ant\_shunt,C}$;
measuring a third value $|\Gamma_A|$ of a reflection coefficient magnitude at said circuit side shunt;
computing three values of voltage standing wave ratio from said values $|\Gamma_A|$, $|\Gamma_B|$ and $|\Gamma_C|$, respectively, using the formulae:

$$V_A = \frac{1+|\Gamma_A|}{1-|\Gamma_A|},$$

$$V_B = \frac{1+|\Gamma_B|}{1-|\Gamma_B|}, \text{ and}$$

$$V_C = \frac{1+|\Gamma_C|}{1-|\Gamma_C|};$$

computing coordinates of centers of three voltage standing wave ratio (VSWR) circles in an admittance plane, using the formulae:

$$C_A = \frac{\frac{V_A^2+1}{2V_A} - j\left(\frac{1}{x_2} - b_{ckt\_shunt,A}\right)}{x_2^2\left(1+\left(\frac{1}{x_2} - b_{ant\_shunt,A}\right)^2\right)} + j\left(\frac{1}{x_2} - b_{ant\_shunt,A}\right),$$

$$C_B = \frac{\frac{V_B^2+1}{2V_B} - j\left(\frac{1}{x_2} - b_{ckt\_shunt,B}\right)}{x_2^2\left(1+\left(\frac{1}{x_2} - b_{ant\_shunt,B}\right)^2\right)} + j\left(\frac{1}{x_2} - b_{ant\_shunt,B}\right), \text{ and}$$

$$C_C = \frac{\frac{V_C^2+1}{2V_C} - j\left(\frac{1}{x_2} - b_{ckt\_shunt,C}\right)}{x_2^2\left(1+\left(\frac{1}{x_2} - b_{ant\_shunt,C}\right)^2\right)} + j\left(\frac{1}{x_2} - b_{ant\_shunt,C}\right);$$

computing radii of said three VSWR circles, using the formulae:

$$R_A = \frac{\frac{V_A^2-1}{2V_A}}{x_2^2\left(1+\left(\frac{1}{x_2} - b_{ckt\_shunt,A}\right)^2\right)},$$

$$R_B = \frac{\frac{V_B^2-1}{2V_B}}{x_2^2\left(1+\left(\frac{1}{x_2} - b_{ckt\_shunt,B}\right)^2\right)}, \text{ and}$$

$$R_C = \frac{\frac{V_C^2-1}{2V_C}}{x_2^2\left(1+\left(\frac{1}{x_2} - b_{ckt\_shunt,C}\right)^2\right)};$$

computing coordinates ($x_{int}$, $y_{int}$) of a triple intersection of said three VSWR circles; and computing an antenna conductance $g_{ant}$ and an antenna susceptance $b_{ant}$ of said antenna admittance, using the formulae:

$$g_{ant} = \frac{(x_{int} \times \text{Re}(C_B - C_A)) + (y_{int} \times \text{Im}(C_B - C_A)) + \text{Re}(C_A)}{\sqrt{(\text{Re}(C_B - C_A))^2 + (\text{Im}(C_B - C_A))^2}}, \text{ and}$$

$$b_{ant} = \frac{(x_{int} \times \text{Im}(C_B - C_A)) - (y_{int} \times \text{Re}(C_B - C_A)) + \text{Im}(C_A)}{\sqrt{(\text{Re}(C_B - C_A))^2 + (\text{Im}(C_B - C_A))^2}};$$

using a controller circuit coupled to said matching network, computing a target susceptance $b_{ant\_shunt,tgt}$ of said antenna side shunt, using the formula:

$$b_{3-out,target} = \frac{1}{x_2} - \sqrt{\left(\frac{1}{2x_2^2}\right)^2 - \left(g_{antenna} - \frac{1}{2x_2^2}\right)^2}$$

if $0 < g_{antenna} < \frac{1}{x_2^2}$ or $$b_{3-out,target} = \frac{1}{x_2} \text{ if } g_{antenna} > \frac{1}{x_2^2}, \text{ and}$$

$$b_{ant\,shunt,target} = b_{3-out,target} - b_{antenna};$$

where:

$g_{antenna}$ and $b_{antenna}$ are a conductance and susceptance, respectively, of said antenna coupled to said matching network, and $x_2$ is a reactance of a series element of said matching network between said antenna side shunt and said circuit side shunt;

using said controller circuit, determining a tuned susceptance of said antenna side shunt from a list of possible susceptance values of said antenna side shunt corresponding to possible capacitance values of said antenna side variable capacitor such that said tuned susceptance of said antenna side shunt is closest to said target susceptance of said antenna side shunt;

using said controller circuit, determining a tuned capacitance value of said antenna side variable capacitor which corresponds to said tuned susceptance of said antenna side shunt;

using said controller circuit, computing a tuned susceptance value $b_{2-out,tune}$ at a reference plane in said matching network between said series element and said circuit side shunt, using the formula:

$$b_{2-out,tune} = \text{Im}\left(\frac{g_{antenna} + j(b_{antenna} + b_{ant\,shunt,tune})}{1 + jx_2(g_{antenna} + j(b_{antenna} + b_{ant\,shunt,tune}))}\right);$$

using said controller circuit, computing a target susceptance $b_{ckt\_shunt,tgt}$ of said circuit side shunt, using the formula:

$$b_{ckt\_shunt,target} = -b_{2-out,tune};$$

using said controller circuit, determining a tuned susceptance of said circuit side shunt from a list of possible susceptance values of said circuit side shunt corresponding to possible capacitance values of a circuit side variable capacitor of said circuit side shunt, such that said tuned susceptance of said circuit side shunt is closest to said target susceptance of said circuit side shunt;

using said controller ciruit, determining a tuned capacitance value of said circuit side variable capacitor which corresponds to said tuned susceptance of said circuit side shunt; and using said controller circuit, setting said circuit side and antenna side variable capacitors to said tuned capacitance values .

13. The process of claim 12, in which:

said step of identifying said tuned susceptance of said antenna side shunt is performed using a look-up table of said possible susceptance values of said antenna side shunt; and said step of identifying said tuned susceptance of said circuit side shunt is performed using a look-up table of said possible susceptance values of said circuit side shunt.

14. The process of claim 12, in which:
said step of identifying said tuned susceptance of said antenna side shunt is performed using a circuit model of said antenna side shunt; and
said step of identifying said tuned susceptance of said circuit side shunt is performed using a circuit model of said circuit side shunt.

15. The process of claim 12, in which said coordinates ($x_{int}$, $y_{int}$) of said triple intersection of said three VSWR circles are computed by a process including steps:
computing intermediate formulae d, p and q, using the formulae:

$$d = \sqrt{(\text{Re}(C_B - C_A))^2 + (\text{Im}(C_B - C_A))^2},$$

$$p = \frac{(\text{Re}(C_B - C_A) \times \text{Re}(C_C - C_A)) + (\text{Im}(C_B - C_A) \times \text{Im}(C_C - C_A))}{d},$$

and $$q = \frac{(\text{Im}(C_B - C_A) \times \text{Re}(C_C - C_A)) - (\text{Re}(C_B - C_A) \times \text{Im}(C_C - C_A))}{d}; \text{ and}$$

computing said coordinates ($x_{int}$, $y_{int}$) of said triple intersection using the formulae:

$$x_{int} = \frac{R_A^2 - R_B^2 + d^2}{2d}, \text{ and}$$

$$y_{int} = \frac{R_A^2 - R_A^2 + p^2 + q^2}{2q} - \frac{p(R_A^2 - R_B^2 + d^2)}{2qd}.$$

16. The process of claim 12, in which:
said first circuit side capacitance value $C_{ckt\_shunt,A}$ is a minimum of a set of circuit side capacitances; and
said first antenna side capacitance value $C_{ant\_shunt,A}$ is a minimum of a set of antenna side capacitances.

17. The process of claim 12, in which:
said second circuit side capacitance value $C_{ckt\_shunt,B}$ is at or near a minimum of a set of circuit side capacitances; and
said second antenna side capacitance value $C_{ant\_shunt,B}$ is at or near an average value of a set of antenna side capacitances.

18. The process of claim 12, in which:
said third circuit side capacitance value $C_{ckt\_shunt,B}$ is at or near an average value of a set of circuit side capacitances; and
said third antenna side capacitance value $C_{ant\_shunt,B}$ is at or near a minimum of a set of antenna side capacitances.

19. The process of claim 12, in which:
said third circuit side capacitance value $C_{ckt\_shunt,B}$ is at or near an average value of a set of circuit side capacitances; and
said third antenna side capacitance value $C_{ant\_shunt,B}$ is at or near an average value of a set of antenna side capacitances.

20. The process of claim 12, further including the steps:
setting said circuit side variable capacitor to a fourth circuit side capacitance value $C_{ckt\_shunt,D}$, so that said circuit side shunt has a susceptance $b_{ckt\_shunt,D}$;
setting an antenna side variable capacitor to a fourth antenna side capacitance value $C_{ant\_shunt,D}$, so that said antenna side shunt has a susceptance $b_{ant\_shunt,D}$;
measuring a fourth value $|\Gamma_D|$ of a reflection coefficient magnitude at said circuit side shunt; and
selecting three of said $|\Gamma_A|$, $|\Gamma_B|$, $|\Gamma_C|$ and $|\Gamma_D|$ values for computing said antenna conductance $g_{ant}$ and said antenna susceptance $b_{ant}$.

* * * * *